US005526236A

United States Patent [19]

Burnes et al.

[11] Patent Number: 5,526,236

[45] Date of Patent: Jun. 11, 1996

[54] LIGHTING DEVICE USED IN AN EXIT SIGN

[75] Inventors: James J. Burnes, Deep River; Charles R. Rukouski, Danbury, both of Conn.

[73] Assignee: General Signal Corporation, Stamford, Conn.

[21] Appl. No.: 281,414

[22] Filed: Jul. 27, 1994

[51] Int. Cl.$^6$ .................................................. G09F 13/04
[52] U.S. Cl. .................. 362/20; 362/249; 362/800; 362/812; 362/429; 40/570
[58] Field of Search ................... 362/20, 812, 800, 362/249, 429; 40/570, 541

[56] References Cited

U.S. PATENT DOCUMENTS

| | | |
|---|---|---|
| 844,087 | 2/1907 | Bellamy . |
| 859,199 | 7/1907 | Chinnery . |
| 2,915,844 | 12/1959 | Thomas . |
| 3,309,806 | 3/1967 | Gallagher . |
| 3,324,290 | 6/1967 | Lasker . |
| 3,560,729 | 2/1971 | Liberman . |
| 3,864,861 | 2/1975 | Hill, Jr. . |
| 4,139,957 | 2/1979 | Minoque . |
| 4,211,955 | 7/1980 | Ray . |
| 4,234,914 | 11/1980 | Boesen . |
| 4,254,453 | 3/1981 | Mouyard et al. .................. 362/240 |
| 4,259,800 | 4/1981 | Schoenfeld . |
| 4,271,408 | 6/1981 | Teshima et al. . |
| 4,298,869 | 11/1981 | Okuno ................................ 340/782 |
| 4,345,308 | 8/1982 | Mouyard et al. . |
| 4,383,382 | 5/1983 | Hegarty ............................. 40/545 |
| 4,435,743 | 3/1984 | Plumly ............................. 362/20 |
| 4,443,835 | 4/1984 | Bräutigam et al. . |
| 4,630,183 | 12/1986 | Fujita ............................... 362/311 |
| 4,682,147 | 7/1987 | Bowman ........................... 340/286 |
| 4,720,709 | 1/1988 | Imamura et al. . |
| 4,724,629 | 2/1988 | Walton ............................. 40/451 |
| 4,727,289 | 2/1988 | Uchida ............................. 315/71 |
| 4,768,300 | 9/1988 | Rutili . |
| 4,782,429 | 11/1988 | Walton et al. .................... 362/20 |
| 4,849,864 | 7/1989 | Forrest . |
| 4,884,178 | 11/1989 | Roberts . |
| 4,929,866 | 5/1990 | Murata et al. . |
| 4,951,406 | 8/1990 | Lemire . |
| 4,965,457 | 10/1990 | Wrobel et al. ................... 362/249 |
| 4,967,317 | 10/1990 | Plumly . |
| 5,012,157 | 4/1991 | Walton et al. .................... 315/66 |
| 5,018,290 | 5/1991 | Kozek et al. ..................... 40/570 |
| 5,020,252 | 6/1991 | De Boef . |
| 5,036,248 | 7/1991 | McEwan et al. . |
| 5,136,483 | 8/1992 | Schöniger et al. . |
| 5,160,201 | 11/1992 | Wrobel ............................. 362/249 |
| 5,268,828 | 12/1993 | Miura . |
| 5,276,591 | 1/1994 | Hegarty . |
| 5,299,109 | 3/1994 | Grondal . |
| 5,303,124 | 4/1994 | Wrobel . |

OTHER PUBLICATIONS

Brochure—The Lumacell LEADER (LER Universal Retrofit Module).
LPR Installation Instructions—Isolite.
Brochure—Model LPR Retrofit Module—Isolite.
Brochure—The Lumacell Leader (LER Series Module).
Brochure—Isolite's New LitePak.
Brochure—Astralite 2000 LED Exit Sign Retrofit Kit.
Single Sided L.E.D. Retrofit Kit Instructions.
Dual-Lite brochure—We've Created A Masterpiece. Again.

*Primary Examiner*—Ira S. Lazarus
*Assistant Examiner*—Sara Sachie Raab
*Attorney, Agent, or Firm*—Ware, Fressola, Van Der Sluys & Adolphson

[57] ABSTRACT

In a lighting fixture such as an exit sign, a light emitting diode lighting device is provided for mating engagement with an electrical socket of the lighting fixture. The light emitting diode device has a plurality of light emitting diodes recessed in a U-shaped channel for directing light through a diffuser into a desired illumination pattern.

24 Claims, 4 Drawing Sheets

LIGHTING DEVICE USED IN AN EXIT SIGN

BACKGROUND OF THE INVENTION

The present invention relates generally to electrical lighting sources and, more particularly, to electrical lighting sources in illuminated exit signs.

Under current local fire and building codes, buildings to which the public has access are required to have signage therein identifying the exits. Most of these signs are required to exhibit a specific amount of illumination and, oftentimes, must have an emergency backup power source to provide emergency illumination to the light for a specified period of time during periods when utility power to the building is discontinued, thereby facilitating egress of persons from the building.

Traditionally, two 15-watt incandescent lamps driven by 120 volt alternating current (120 VAC) have been employed to provide normal illumination while two 3.6-watt incandescent lamps driven by a self contained emergency battery power supply are used for illumination during power failure situations. A switching or transfer device will automatically operate the emergency backup illumination system when a power failure is detected.

While these traditional exit sign lighting arrangements perform adequately, they do have a few drawbacks. A major drawback is that the incandescent bulbs use large amounts of electric power thus requiring a relatively large emergency battery power supply for use during emergency lighting situations. Furthermore, while the incandescent bulbs provide adequate illumination, such bulbs do not have a long life in service and require frequent replacement.

To alleviate the drawbacks associated with incandescent bulbs, many manufacturers are beginning to utilize light emitting diodes (LEDs) rather than incandescent bulbs in exit signs. Each light emitting diode provides a relatively small amount of light as compared to the traditional incandescent bulbs whereby a large number of light emitting diodes must be used to provide the same amount of illumination offered by the traditional incandescent bulbs.

It is an object of the present invention to provide a novel lighting device for an exit sign using a plurality of light emitting diodes.

It is also an object to provide such a lighting device which allows the light emitting diodes to be powered by both the normal utility electrical power (120 VAC) and, during emergency power situations, an emergency battery power supply and associated charging and transfer circuitry.

Still another object is to provide such a lighting device in which the light emitting diodes are arranged in the exit sign to provide the amount of illumination required by building codes.

A further object is to provide such a lighting device which may be readily and economically fabricated and will enjoy a long life in operation.

SUMMARY OF THE INVENTION

It has now been found that the foregoing and related objects can be readily attained in an exit sign having a sign housing defining an enclosure therein and having indicia to be illuminated as well as at least one lighting device within the enclosure for illuminating the indicia. Each lighting device comprises a lighting device housing having a light directing channel in one side thereof, an illumination source in the lighting device housing and a diffuser mounted to the lighting device housing adjacent the channel. The illumination source includes a plurality of light emitting diodes recessed in the light directing channel whereby light from the light emitting diodes is directed by the light directing channel through the diffuser into the enclosure to illuminate the indicia.

According to the invention, the light directing channel has sloping side walls and is U-shaped. The lighting device housing has a groove therein in which the diffuser is slideable positioned. The diffuser has a light distributing surface thereon which distributes light from the illumination source.

Ideally, the plurality of light emitting diodes are mounted on a printed circuit board positioned in the lighting device housing. The printed circuit board is electrically connected to the mounting base assembly for electrically connecting the illumination source to a primary electric power source. The printed circuit board also has electrical components thereon for the light emitting diodes.

In accordance with the present invention, the mounting base assembly is matingly received in the exit sign housing through relative rotational and axial movement therebetween. Once it is full inserted, the mounting base assembly permits orientation of the lighting device housing relative to the mounting base assembly.

Desirably, an emergency electric power circuit in the lighting device housing is operationally connected to the primary electric power circuit through the mounting base assembly to detect failure of the primary electric power circuit and thereafter provided auxiliary power to the illumination source. The emergency electric power circuit includes at least one rechargeable battery and a charging device for keeping the at least one rechargeable battery fully charged during periods of nonuse.

The invention will be fully understood when reference is made to the following detailed description taken in conjunction with the accompanying drawings.

DETAILED DESCRIPTION OF THE INVENTION

Figure 1:
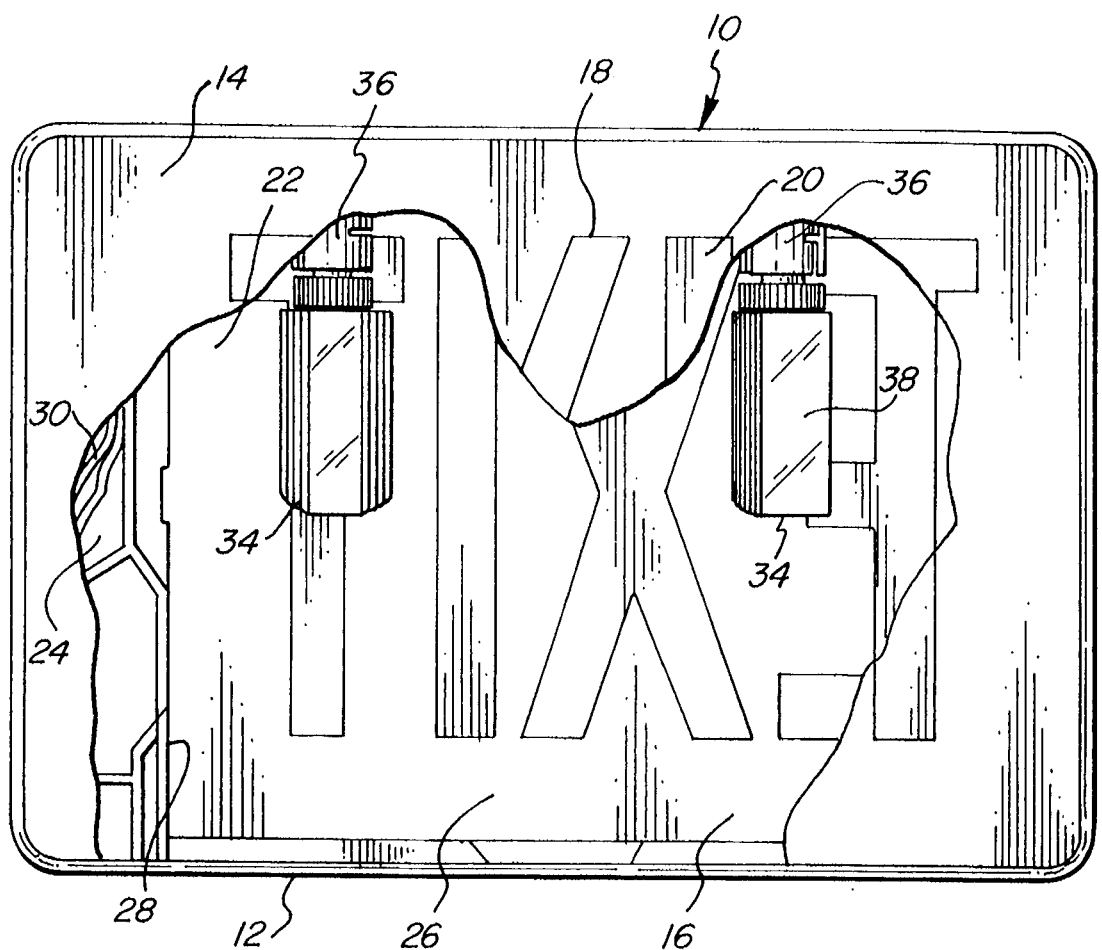
FIG. 1 is a side elevational view of an exit sign housing with portions removed and broken away to illustrate internal structure including two light emitting diode lighting devices made in accordance with the present invention.
Figure 3:
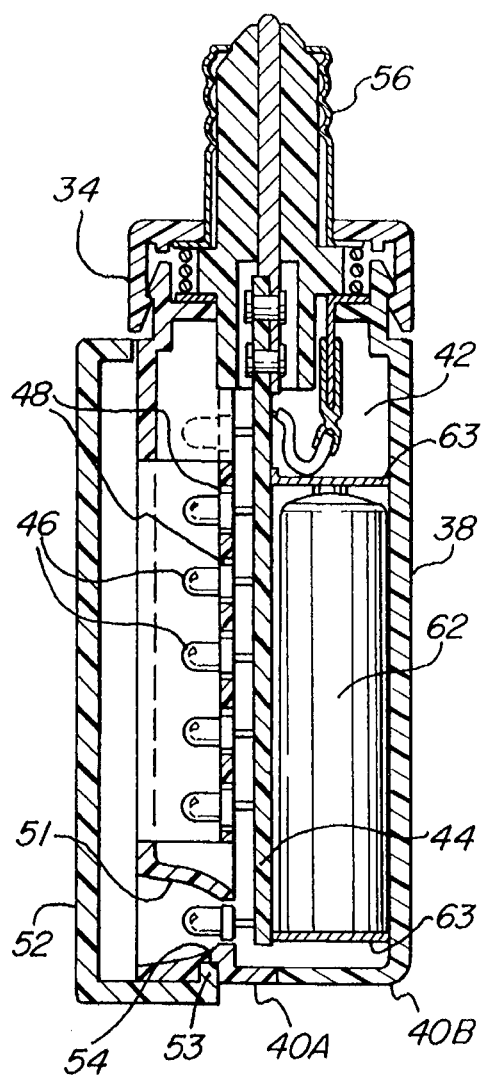
FIG. 3 is a cross-sectional view of the light emitting diode lighting device taken along the 3—3 line of FIG. 2.
Figure 2:
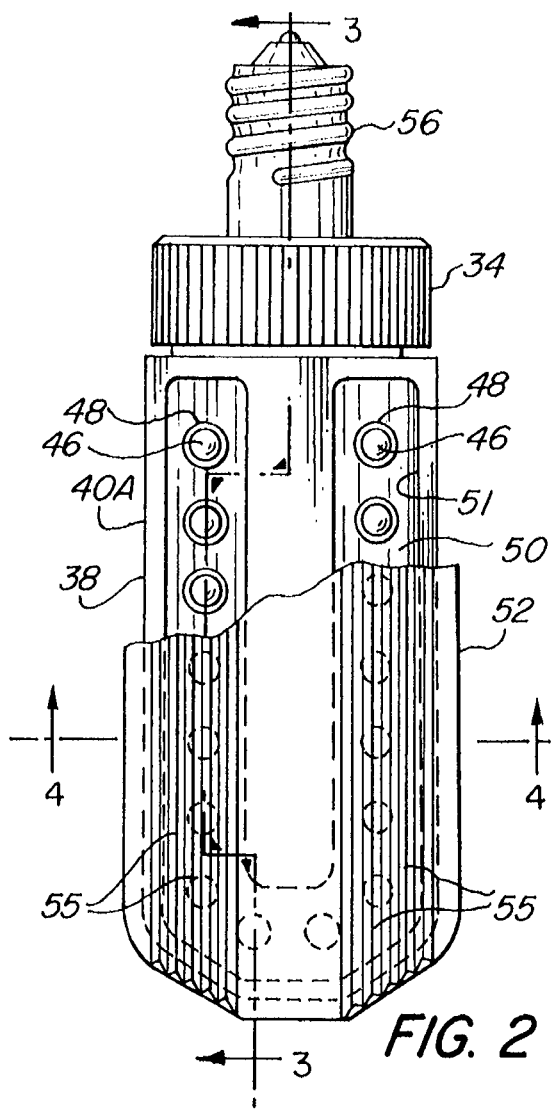
FIG. 2 is a side elevational view of the light emitting diode lighting device of the present invention with a portion of the diffuser broken away to illustrate internal structure.

Referring first to FIG. 1 of the drawings, therein illustrated is an exit sign generally designated by the numeral 10. The exit sign 10 is mountable to both a canopy bracket (not shown) and a standard electrical junction box (not shown) in a manner explained in U.S. Pat. No. 5,272,605, entitled CANOPY MOUNTING DEVICE FOR EXIT SIGNS AND THE LIKE. With this arrangement, the exit sign construction of this invention can be mounted directly to a standard electrical junction box found in a ceiling or wall of a building in any desired location.

The exit sign 10 comprises a central rectangularly shaped frame 12 with front and back cover members 14 and 16, at least one of which incorporates a large stencil 18 having the letters "EXIT" in the major surface thereof and a colored plastic diffuser 20 therebehind. The central rectangularly shaped frame 12 and the front and back cover members 14 and 16 are snap-fit together and cooperate to form a sign housing having an enclosure 22 containing the necessary internal electrical lighting components. The front and back covers 14, 16 can use a plurality of finger clips (not shown) to hold them in assembly with the central rectangularly shaped frame 12. The exit sign 10 is preferably molded from a plastic resin such as an engineering type thermoplastic such as ABS, polycarbonate or polyphenylene oxide but it should be apparent to those skilled in the art that they may be manufactured from other suitable materials.

The enclosure 22 of the exit sign 10 is divided into a wiring compartment 24 and a lighting compartment 26 by a retaining wall 28 which extends around the interior sides and top of the central rectangularly shaped frame 12. In a manner explained further hereinafter, the wiring compartment 24 contains an appropriate wiring harness 30 for powering two 1-watt direct current light emitting diode lighting devices 34 held by standard screw type lamp sockets 36 extending downwardly into the lighting compartment 26 from an upper part of the retaining wall 28.

Figure 4:
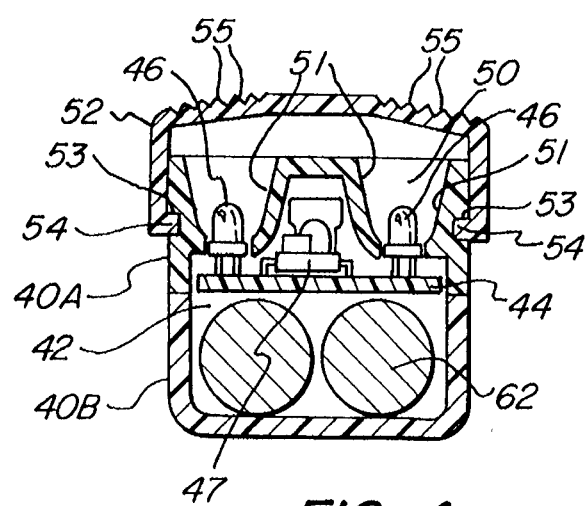
FIG. 4 is a cross-sectional view of the light emitting diode lighting device taken along the 4—4 line of FIG. 2.
Figure 5:
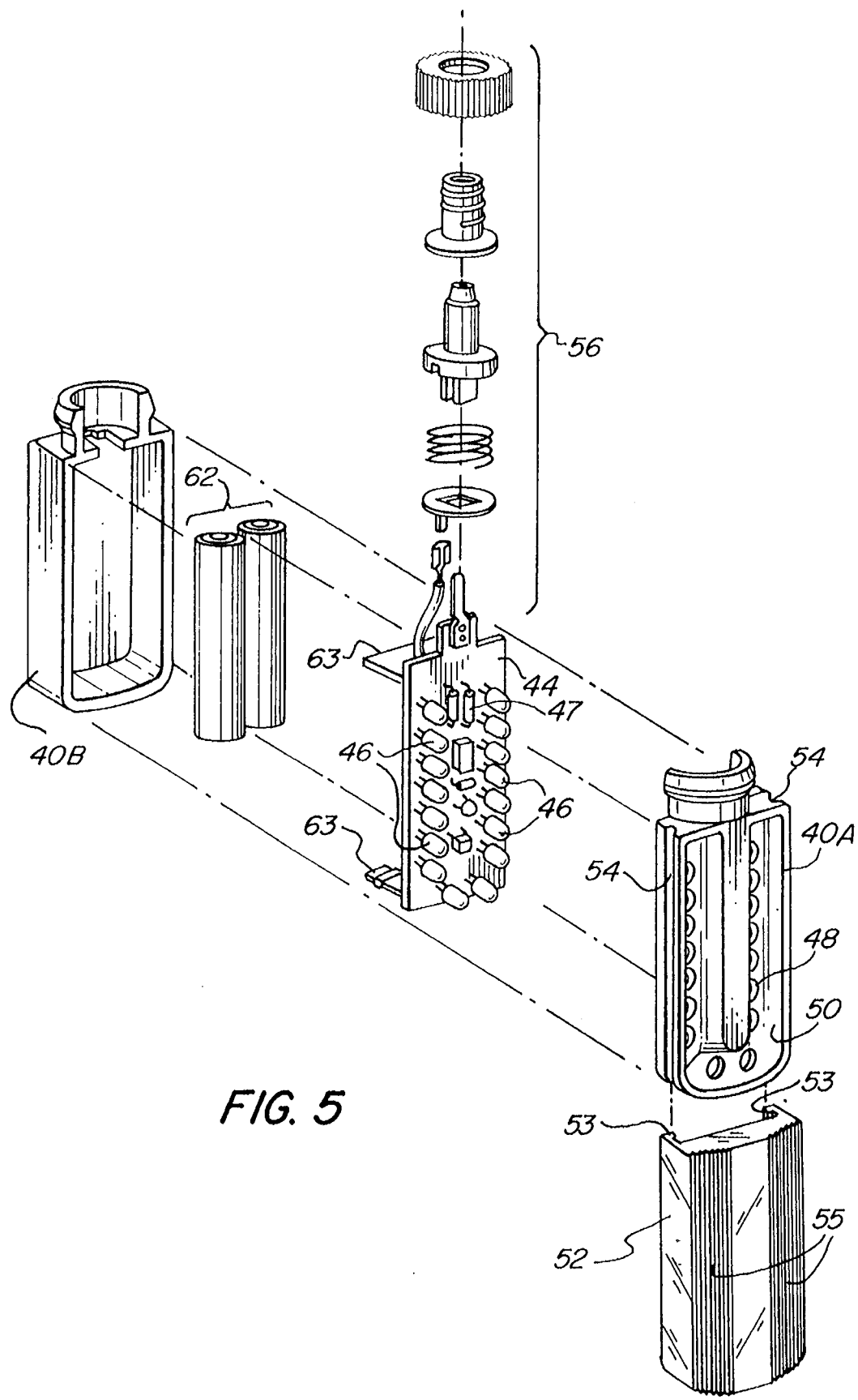
FIG. 5 is an exploded perspective view of the light emitting diode device of the present invention.

Referring to FIGS. 2–5 taken in conjunction with FIG. 1, each of the light emitting diode lighting devices 34 has an elongated generally rectangular plastic lighting device housing 38 having front and rear halves 40A,40B forming an enclosure 42. Inside the enclosure 42 in the elongated rectangular plastic housing 38 is a printed circuit board 44 with a plurality of light emitting diodes 46 in a U-shaped pattern on one side thereof with a plurality of electrical components 47 (FIG. 4) positioned between the light emitting diodes. The light emitting diodes 46 extend parallel to one another and are positioned to extend through apertures 48 in a U-shaped channel 50 in the front half 40A. The U-shaped channel 50 has sloping side walls 51 designed to direct light rays from the light emitting diodes 46 in an appropriate illumination pattern. As shown in FIG. 4, the electrical components 47, whose function and operation will be explained further hereinafter, extend into a cavity formed by the sloping side walls 51 in the center of the elongated rectangular plastic housing 38.

The plastic housing 38 can be made of an opaque material such as polyphenylene oxide (NORYL N-190 made by General Electric) and polycarbonate (XANTAR G4F-23R made by DSM Polymers & Hydrocarbons BV). Desirably, to achieve a satisfactory dispersion of the light emanating from the light emitting diodes 46, the lighting device housing 38 is provided with a translucent or clear plastic diffuser 52. The diffuser 52 has a lip portion 53 slideably received in a groove 54 on the lighting device housing 38 and has longitudinally extending ribbed surfaces 55 to scatter the light rays as they pass through the diffuser 52.

As illustrated in FIG. 1, in order for light rays from the light emitting diode lighting devices 34 to evenly illuminate the stencil 18 when they pass through the diffuser 20, the position of the light emitting diode lighting devices 34 can be adjusted to obtain the desired illumination. To obtain this type of adjustment, the light emitting diode lighting devices 34 are provided with mounting base assemblies 56 which permit adjustment of the elongated rectangular plastic housings 38 relative to the mounting base assemblies 56 once the assemblies 56 are fully inserted and tightened into their respective screw-type lamp sockets 36. The adjustment of the elongated rectangular plastic housings 38 relative to the mounting base assemblies 56 is described in a copending U.S. Patent application Ser. No. 08/160423 filed Dec. 1, 1993 entitled MOUNTING BASE ASSEMBLY FOR A LIGHTING DEVICE USED IN AN EXIT SIGN by inventors Charles R. Ruskouski and James J. Burnes, which is hereby incorporated by reference, with particular reference to FIGS. 5 and 6 and the description thereof.

Figure 6:
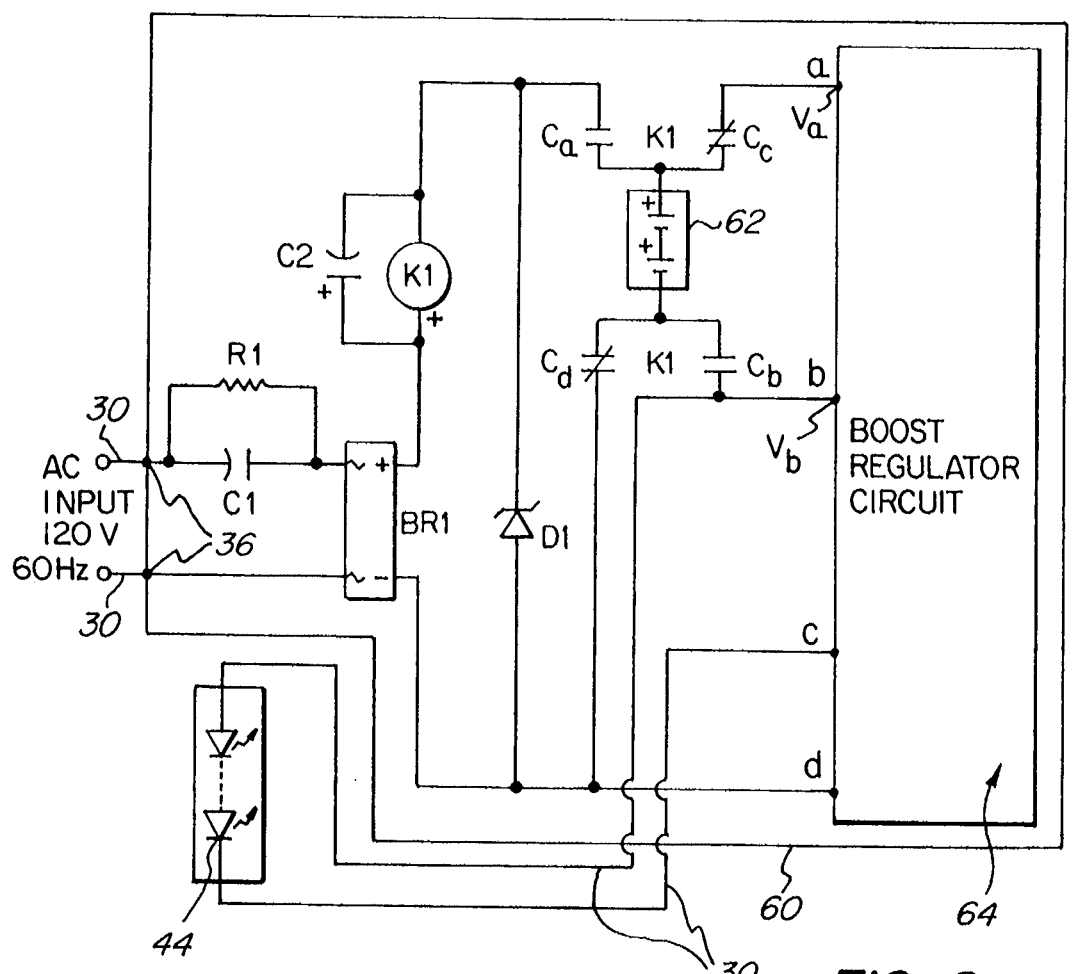
FIGS. 6 and 6A show an electrical schematic for the exit sign of FIG. 1.
Figure 6A:
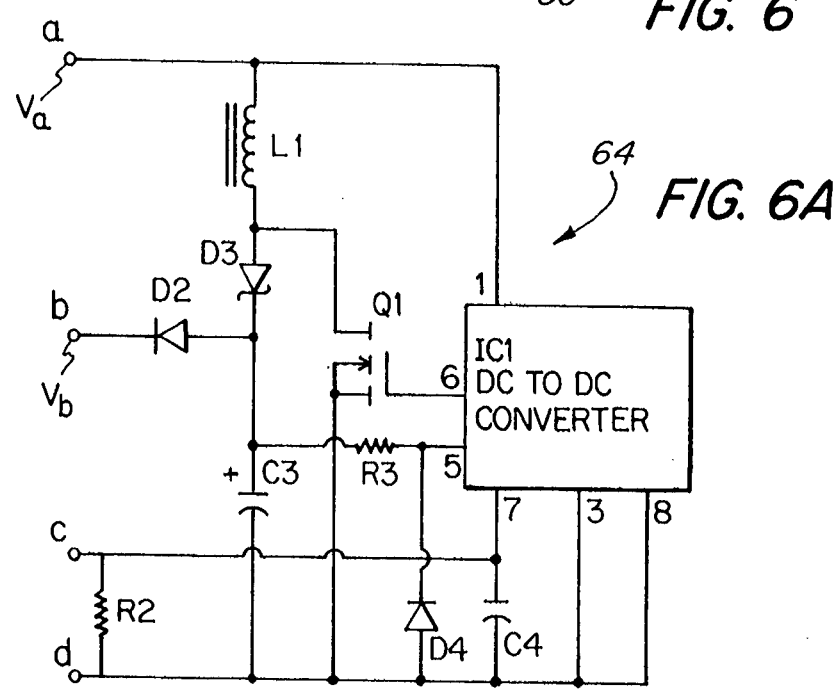

Turning now to FIGS. 6 and 6A taken in conjunction with FIG. 1, to power the light emitting diode lighting devices 34, the utility power (120 VAC) is provided to the wiring harness 30 through electrical leads (not shown) which extend into an electrical junction box (not shown) found in the ceiling or wall of the building. Each light emitting diode lighting device 34 incorporates a battery charger and converter circuit 60 on the printed circuit board 44. The circuit 60 is designed in a manner well known to those skilled in the art to rectify the utility power into direct current and charge an auxiliary rechargeable battery pack 62 located in the lighting device housing 38 between two electrical contacts 63 (FIGS. 3 and 5) extending from the printed circuit board 44. The circuit 60 also is designed to switch between the primary alternating current power supply and the emergency direct power supply provided by the rechargeable battery pack 62 if the alternating current power supply fails as would be the case during a utility power outage.

During normal operation, utility power on the wiring harness 30 energizes the light emitting diodes 44 and maintains a charge on the battery pack 62 and, during emergency operation when the utility power fails, the battery pack 62 energizes the light emitting diodes 44 until utility power resumes on the wiring harness 30.

When the utility power is supplied on the wiring harness 30, the alternating current is first passed through a current limiting resistor R1 and capacitor C1 and is then passed through a bridge circuit BR1 which rectifies the alternating current into direct current. If the utility power fails, the current in the capacitor C1 discharges through the resistor R1 to prevent electrical shocks. The direct current from the bridge circuit BR1 initially flows through a Zener diode D1 and energizes a coil K1 for closing contacts Ca and Cb and opening contacts Cc and Cd so that the battery pack 62 is connected in series with the coil K1 and the light emitting diodes 44, which are electrically connected in series, parallel or series parallel to one another. This maintains the closure of the contacts Ca and Cb, charges the battery pack 62 and energizes the light emitting diodes 44. At this point, no current flows through the Zener diode D1.

When the utility power is not supplied on the wiring harness 30, the coil K1 is deenergized, which opens the contacts Ca and Cb and closes the contacts Cc and Cd. This causes the battery pack 62 to discharge through a boost regulator circuit 64 (shown in detail in FIG. 9A) which boosts the battery voltage to a level sufficient to operate the light emitting diodes 44. For example, when the utility power is off, the direct current flows from the positive side of the battery pack 62 through the contact Cc, into point a and out point b of the boost regulator circuit 64, where the output voltage Vb is greater than the input voltage Va. The direct current then flows through the light emitting diodes 44 which are electrically connected across points b and c as shown, into point c and out point d of the boost regulator circuit 64, through the contact Cd and back to the negative side of the battery pack 62.

The boost regulator circuit 64 is well known in the art and one example is shown in FIG. 6A. It has an input voltage Va coupled to pin 1 of a DC-to-DC converter IC1 and to one side of an inductor L1. The other side of the inductor L1 is coupled to a drain of a FET transistor Q1 having its gate coupled to pin 6 and its source coupled to ground. A Schottky diode D3 is connected between the drain of the FET transistor Q1 and an output voltage Vb. In operation, the direct current passes into the boost regulator circuit 64 at point a, discharges through the inductor L1 and the diodes D2 and D3, and passes from the boost regulator circuit 64 at point b to the light emitting diodes 44. The inductor L1, the DC-to-DC converter IC1, the FET transistor Q1, the diodes D2 and D3 combined to boost the output voltage Vb so it is greater than the input voltage Va needed to provide the direct current to the light emitting diodes 44. Upon return from the light emitting diodes 44, the direct current passes into the boost regulator circuit 64 at point c, through a resistor R2 and passes from the boost regulator circuit 64 at point d. From there, the direct current passes through the contact Cd and back to the negative side of the battery pack 62 to complete the circuit. The Zener diode D4 fixes the voltage at pin 5 of the DC-to-DC converter IC1. A capacitor C4 filters out undesirable voltage surges at point c of the boost regulator circuit 64, pin 3 is a ground connection for the convertor IC1 and pin 8 is grounded since it is not being used.

It will therefore be seen from the above that the present invention provides an effective light emitting diode lighting device within an exit sign. The exit sign using the light emitting diode lighting devices has the same amount of illumination as found in exit signs using traditional incandescent lamps while at the same time greatly reducing power consumption.

It will thus be seen that the objects set forth above, among those made apparent from the preceding description, are efficiently attained and, since certain changes may be made in the above product without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the invention which, as a matter of language, might be the to fall therebetween.

What is claimed is:

1. A lighting device for illuminating indicia of an exit sign having an enclosure, comprising:
   (a) a lighting device housing having a light directing channel in one side thereof;
   (b) an illumination source in said housing, said illumination source including a plurality of light emitting diodes recessed in said light directing channel;
   (c) a diffuser mounted to said housing adjacent said channel whereby light from said light emitting diodes is directed by said light directing channel through said diffuser into the enclosure to illuminate the indicia of the exit sign; and
   (c) a mounting base assembly on said housing for electrically connecting said illumination source to the exit sign, said mounting base assembly permitting orientation of said housing relative to said mounting base assembly.

2. The lighting device in accordance with claim 1, wherein said light directing channel is U-shaped.

3. The lighting device in accordance with claim 1, wherein said light directing channel has sloping side walls.

4. The lighting device in accordance with claim 3, wherein said light directing channel is U-shaped.

5. The lighting device in accordance with claim 1, wherein said housing has a groove therein in which said diffuser is slidably positioned.

6. The lighting device in accordance with claim 1, wherein said diffuser has a light distributing surface thereon which distributes light from said illumination source.

7. The lighting device in accordance with claim 1, wherein said plurality of light emitting diodes are mounted on a printed circuit board.

8. The lighting device in accordance with claim 7, wherein said printed circuit board has electrical components thereon electrically connected to said illumination source, said electrical components also being electrically connected to a source of electrical power for providing power to said illumination source.

9. The lighting device in accordance with claim 1, wherein said mounting base assembly is matingly received in the exit sign through relative rotational and axial movement therebetween.

10. The lighting device in accordance with claim 1, wherein said mounting base assembly is adapted to connect to a primary electric power circuit of the exit sign, and wherein an emergency electric power circuit in said housing is operationally connected to the primary electric power circuit through said mounting base assembly to detect failure of the primary electric power circuit and thereafter provide auxiliary power to said illumination source.

11. The exit sign in accordance with claim 10, wherein said emergency electric power circuit includes at least one rechargeable battery.

12. The exit sign in accordance with claim 11, wherein said emergency electric power circuit includes a charging device for keeping said at least one rechargeable battery fully charged during periods of nonuse.

13. An exit sign, comprising:
   (a) a sign housing defining an enclosure therein and having indicia to be illuminated; and
   (b) at least one lighting device within said enclosure for illuminating said indicia, each lighting device comprising:
      (i) a lighting device housing having a light directing channel in one side thereof;
      (ii) an illumination source in said lighting device housing, said illumination source including a plurality of light emitting diodes recessed in said light directing channel;
      (iii) a diffuser mounted to said lighting device housing adjacent said channel whereby light from said light emitting diodes is directed by said light directing channel through said diffuser into said enclosure to illuminate said indicia; and
      (iv) a mounting base assembly on said lighting device housing for electrically connecting said illumination source to a primary electric power circuit, said mounting base assembly permitting orientation of said housing relative to said mounting base assembly.

14. The exit sign in accordance with claim 13, wherein said light directing channel is U-shaped.

15. The exit sign in accordance with claim 13, wherein said light directing channel has sloping side walls.

16. The exit sign in accordance with claim 15, wherein said light directing channel is U-shaped.

17. The exit sign in accordance with claim 13, wherein said lighting device housing has a groove therein in which said diffuser is slidably positioned.

18. The exit sign in accordance with claim 13, wherein said diffuser has a light distributing surface thereon which distributes light from said illumination source.

19. The exit sign in accordance with claim 13, wherein said plurality of light emitting diodes are mounted on a printed circuit board.

20. The exit sign in accordance with claim 19, wherein said printed circuit board has electrical components thereon electrically connected to said illumination source, said electrical components also being electrically connected to a primary electric power circuit for providing power to said illumination source.

21. The exit sign in accordance with claim 13, wherein said mounting base assembly is matingly received in said sign housing through relative rotational and axial movement therebetween.

22. The exit sign in accordance with claim 13, wherein an emergency electric power circuit in said lighting device housing is operationally connected to the primary electric power circuit through said mounting base assembly to detect failure of the primary electric power circuit and thereafter provide auxiliary power to said illumination source.

23. The exit sign in accordance with claim 22, wherein said emergency electric power circuit includes at least one rechargeable battery.

24. The exit sign in accordance with claim 23, wherein said emergency electric power circuit includes a charging device for keeping said at least one rechargeable battery fully charged during periods of nonuse.

* * * * *

UNITED STATES PATENT AND TRADEMARK OFFICE
CERTIFICATE OF CORRECTION

PATENT NO. : 5,526,236
DATED : June 11, 1996
INVENTOR(S) : Burnes et al.

It is certified that error appears in the above-indentified patent and that said Letters Patent is hereby corrected as shown below:

>Title page, item [75]:
>"Charles R. Rukouski" should read --Charles R. Ruskouski--

Signed and Sealed this

Twenty-seventh Day of August, 1996

Attest:

BRUCE LEHMAN

Attesting Officer          Commissioner of Patents and Trademarks